United States Patent
Edgar et al.

(10) Patent No.: US 10,298,039 B2
(45) Date of Patent: May 21, 2019

(54) POWER SUPPLY APPARATUS

(71) Applicant: Intelligent Energy Limited, Loughborough (GB)

(72) Inventors: David Edgar, Loughborough (GB); Graham Kirsopp, Loughborough (GB)

(73) Assignee: Intelligent Energy Limited, Loughborough (GB)

( * ) Notice: Subject to any disclaimer, the term of this patent is extended or adjusted under 35 U.S.C. 154(b) by 0 days.

(21) Appl. No.: 15/302,267

(22) PCT Filed: Mar. 18, 2015

(86) PCT No.: PCT/GB2015/050793
§ 371 (c)(1),
(2) Date: Oct. 6, 2016

(87) PCT Pub. No.: WO2015/155499
PCT Pub. Date: Oct. 15, 2015

(65) Prior Publication Data
US 2017/0025875 A1      Jan. 26, 2017

(30) Foreign Application Priority Data
Apr. 7, 2014 (GB) .................... 1406242.6

(51) Int. Cl.
*H02J 7/00* (2006.01)
*G01R 19/165* (2006.01)
*B60L 11/18* (2006.01)

(52) U.S. Cl.
CPC ............. *H02J 7/0054* (2013.01); *B60L 11/18* (2013.01); *B60L 11/1851* (2013.01); *G01R 19/165* (2013.01); *H02J 7/00* (2013.01)

(58) Field of Classification Search
CPC ..... H02J 7/0054; B60L 11/18; B60L 11/1851; G01R 19/165
(Continued)

(56) References Cited

U.S. PATENT DOCUMENTS 6,781,343 B1 * 8/2004 Demachi ............ B60L 11/1853
   320/101
6,979,507 B2 * 12/2005 Edlund ............. H01M 8/04089
   429/424

(Continued)

FOREIGN PATENT DOCUMENTS

EP   2590256 A1   5/2013
EP   2639926 A2   9/2013
(Continued)

OTHER PUBLICATIONS

"GB Search Report in Application No. GB1406242.6 dated Nov. 3, 2014, 10 pages".
(Continued)

*Primary Examiner* — M Baye Diao
(74) *Attorney, Agent, or Firm* — BakerHostetler

(57) ABSTRACT

A power supply apparatus for providing electrical power, the power supply apparatus configured to be coupled to an electronic device to supply power thereto to charge a battery of the electronic device, the apparatus comprising a fuel cell configured to receive a supply of a fuel for generating said electrical power, the apparatus further including a controller configured to determine the power flow to the electronic device to interrupt the supply of power to the electronic device prior to the battery of the electronic device reaching a fully charged state.

14 Claims, 2 Drawing Sheets

(58) Field of Classification Search
USPC .......................................................... 320/101
See application file for complete search history.

(56) References Cited

U.S. PATENT DOCUMENTS

| | | | |
|---|---|---|---|
| 6,992,401 B1 | 1/2006 | Johnson | |
| 7,928,687 B2* | 4/2011 | Noda ..................... | H02J 7/0068 320/101 |
| 8,261,102 B2* | 9/2012 | Cheng .................... | G06F 1/263 307/18 |
| 8,410,749 B2* | 4/2013 | Oto ........................ | H01M 10/44 320/101 |
| 8,639,954 B2* | 1/2014 | Winkler ................ | H02J 7/0068 713/300 |
| 8,922,329 B2* | 12/2014 | Davis ..................... | H02J 7/025 340/3.1 |
| 9,048,665 B2* | 6/2015 | Wojcik .................. | H05K 5/0086 |
| 9,804,897 B2* | 10/2017 | Song ...................... | G06F 9/45558 |
| 2002/0114986 A1 | 8/2002 | Aoyagi | |
| 2005/0007063 A1* | 1/2005 | Sekai ...................... | G06F 1/263 320/101 |
| 2006/0292405 A1 | 12/2006 | Jang | |
| 2007/0237989 A1* | 10/2007 | Norimatsu ........ | H01M 8/04559 429/9 |
| 2007/0285048 A1* | 12/2007 | Leach ............... | H01M 8/04619 320/101 |
| 2008/0007212 A1* | 1/2008 | Theytaz ................ | H02J 7/0013 320/107 |
| 2009/0061678 A1* | 3/2009 | Minoo .................... | H01R 29/00 439/502 |
| 2009/0079382 A1* | 3/2009 | Norimatsu ........ | H01M 8/04246 320/101 |
| 2009/0128088 A1* | 5/2009 | Bourilkov ......... | H01M 8/04089 320/101 |
| 2009/0278504 A1* | 11/2009 | Tsubota .................. | A61B 6/00 320/152 |
| 2010/0173210 A1 | 7/2010 | Kajiwara | |
| 2010/0216521 A1 | 8/2010 | Wu | |
| 2011/0266994 A1 | 11/2011 | Shimura | |
| 2012/0088170 A1 | 4/2012 | Heo | |
| 2013/0214730 A1* | 8/2013 | Lu .......................... | H02J 7/007 320/107 |
| 2013/0328890 A1* | 12/2013 | Avkarogullari ......... | G06F 1/206 345/501 |
| 2014/0095915 A1 | 4/2014 | Hitchcock | |
| 2014/0167686 A1* | 6/2014 | Raduchel .............. | H04L 67/303 320/107 |
| 2014/0217958 A1* | 8/2014 | Verdun .................. | H02J 7/007 320/107 |
| 2014/0292084 A1 | 10/2014 | Corson | |
| 2014/0312829 A1* | 10/2014 | Ha ......................... | H02J 7/007 320/107 |

FOREIGN PATENT DOCUMENTS

| | | |
|---|---|---|
| JP | 2004-227832 A | 8/2004 |
| JP | 2008004379 A | 1/2008 |
| JP | 2008-067496 A | 3/2008 |
| JP | 2011-083116 A | 4/2011 |
| JP | 2013-081289 A | 5/2013 |
| KR | 20130122558 A | 11/2013 |
| TW | 201312831 A | 3/2013 |
| TW | I396070 B | 5/2013 |
| TW | I406466 B | 8/2013 |
| TW | I416788 B | 11/2013 |
| WO | 0074162 A1 | 12/2000 |
| WO | 2004093288 A1 | 10/2004 |
| WO | 2005088326 A1 | 9/2005 |
| WO | WO 2011/118111 A1 | 9/2011 |
| WO | 2013042243 A1 | 3/2013 |
| WO | 2013061122 A2 | 5/2013 |
| WO | 2013086507 A2 | 6/2013 |

OTHER PUBLICATIONS

"PCT International Search Report and Written Opinion in PCT/GB2015/050793 dated Oct. 2, 2015, 14 pages".

* cited by examiner

POWER SUPPLY APPARATUS

CROSS REFERENCE TO RELATED APPLICATIONS

This is a National Phase entry of International Application No. PCT/GB2015/050793, filed Mar. 18, 2015, which claims priority to Great Britain Application No. 1406242.6, filed Apr. 7, 2014, the disclosures of which are incorporated herein by reference in their entireties.

BACKGROUND OF THE INVENTION

This invention relates to a power supply apparatus for supplying power generated by a fuel cell to an electronic device, possibly for charging a battery of said electronic device. We also disclose a controller for controlling the flow of power between the power supply apparatus and the electronic device.

Fuel cells may be used to provide electrical power for electronic devices, such as mobile telephones, portable music players, tablet computers or laptop computers. Typically these electronic devices receive their power from the mains electricity supply. However, when mains electrical power is not available, for example, a fuel cell based power supply apparatus may be used. Such a fuel cell power supply apparatus may comprise a fuel cell that receives a fuel from a fuel storage vessel and any other reactants and generates electrical power which it can then supply to an electronic device coupled to it. The fuel cell power supply apparatus may be portable and include a replaceable fuel storage vessel and is therefore particularly convenient for providing power to use or charge an electronic device.

Conventional electrochemical fuel cells convert fuel and oxidant, generally both in the form of gaseous streams, into electrical energy and a reaction product. A common type of electrochemical fuel cell for reacting hydrogen and oxygen comprises a polymeric ion (proton) transfer membrane, with fuel and air being passed over respective sides of the membrane. Protons (that is, hydrogen ions) are conducted through the membrane, balanced by electrons conducted through a circuit connecting the anode and cathode of the fuel cell. To increase the available voltage, a stack may be formed comprising a number of such membranes arranged with separate anode and cathode fluid delivery channels. Such a stack is typically in the form of a block comprising numerous individual fuel cell plates held together by end plates at either end of the stack. The anode delivery channels are formed in flow plates that extend between an anode inlet manifold and an anode outlet manifold. The cathode delivery channels are also formed in flow plates between a cathode inlet manifold and a cathode outlet manifold. The fuel cell plates may have the anode delivery channels on one side and the cathode delivery channels on the other side. Electrical energy generated by the stack may be received from stack terminals and can then be supplied to other devices.

BRIEF SUMMARY OF THE INVENTION

According to a first aspect of the invention we provide a power supply apparatus configured to be coupled to an electronic device to supply power thereto to charge a battery of the electronic device, the apparatus comprising a fuel cell configured to receive a supply of a fuel for generating said electrical power, the apparatus further including a controller configured to, based on a determined power flow to the electronic device, interrupt the supply of power to the electronic device prior to the battery of the electronic device reaching a fully charged state.

This is advantageous as the power supply apparatus may be able to operate more efficiently by supplying a charging current, which is of a level to charge the battery, during an initial charging period and then interrupt the supply of the charging current. It is common for batteries, when charging, to draw a charging current of a substantially constant level up until a time when the battery is almost fully charged. The battery then draws a lower current or decreases its current draw over time as the battery reaches a fully charged state. Operating the fuel cell when the battery is drawing a reduced current may be inefficient and therefore the power supply apparatus may shut down the fuel cell when the current drawn by the electronic device/battery falls below a threshold that corresponds to a charge level below fully charged.

The controller may be configured to interrupt the supply of power to the electronic device when the current flow between the apparatus and the electronic device falls below an above-zero threshold current which may be determined by said controller. Thus, the charge state of the battery may be determined by monitoring the current drawn by the battery.

The controller may be configured to determine the threshold current on coupling of the electronic device and the apparatus. The controller may be configured to measure the current flow to the electronic device and, based on said measured current flow, determine the threshold current. The controller may be configured to measure the current flow for determining the threshold current for a predetermined period from when the electronic device is coupled to the apparatus. This is advantageous as the controller may, based on measurement of the substantially constant charging current that the battery draws prior to being almost fully charged, determine the current threshold at which it will stop providing power.

The controller may be configured to, based on the measured current flow, categorise the electronic device to one of a plurality of categories, wherein each category is associated with a different threshold current. It is common for electronic devices or the batteries of electronic devices to draw currents, when charging, that fall within distinct bands. Therefore, categorising the electronic device or its battery based on its initial current draw may enable an appropriate threshold current to be selected.

The controller may be configured to receive a message indicating the threshold current to use for the coupled electronic device. The controller may query an external database using a communications module. The controller may be configured to receive an identification message from the electronic device which identifies the electronic device to the controller and, using the identification message, determine the threshold current to use in supplying power to said electronic device. The controller may receive a product code or vendor identifier when the electronic device is connected to the apparatus.

Using this information the controller may consult a database, internal or external to the apparatus, possibly using the communications module, to determine a threshold current to use when supplying power to charge the device.

The controller may be configured to receive a charge profile message from the electronic device and, using the charge profile message, determine the threshold current to use in supplying power to said electronic device. The charge profile message may contain the threshold current to use to interrupt the supply of power. The charge profile message may be supplied by an application or "app" that is associated with the power supply apparatus and executed on the electronic device. The controller may thus be informed of the current threshold to use for that particular electronic device and can subsequently monitor the current drawn and interrupt the power supply accordingly.

The controller may be configured to determine when to interrupt the supply of power based on an efficiency level of the fuel cell falling below a predetermined efficiency level. Thus, the efficiency level may be defined such that the charging of the electronic device is interrupted prior to the battery reaching a fully charged state.

The power supply apparatus may be portable. The power supply apparatus may be configured to receive a replaceable cartridge of fuel.

According to a second aspect of the invention, we provide a computer program or computer program product for execution on an electronic device, the computer program configured to control a fuel cell based power supply apparatus that is adapted to provide electrical power to the electronic device, wherein the computer program, when executed on the electronic device is configured to;
identify the electronic device; and either
 i) send an identification message to the apparatus which identifies the electronic device to the fuel cell based power supply apparatus; or
 ii) using the identity of the electronic device, determine a charge profile and send a charge profile message containing said charge profile to the apparatus.

The identification message may be used by the power supply apparatus to determine a threshold current at which to interrupt supply of power to the electronic device. The charge profile message may contain the threshold current to use for interrupting supply to the electronic device as described in relation to the first aspect of the invention.

According to a third aspect of the invention, we provide a controller configured to control the flow of a charging current for charging a battery of an electronic device, the charging current supplied by a power supply apparatus, the controller configured to, based on a determination of an operational condition of the electronic device, said operational condition comprising whether or not said electronic device is being used by a user, interrupt the supply of the charging current from the power supply apparatus.

This is advantageous as the controller is able to determine when the electronic device may be unattended and halt the charging of the battery of the electronic device accordingly. This may be advantageous for charging an electronic device on an aircraft. The determination of whether or not said electronic device is being used by a user may be assessed over a usage period of time such that no usage within a predetermined preceding period may be considered to be indicative of the device not being used by the user.

The power supply apparatus may comprise a portable power generation device. The power supply apparatus may comprise a fuel cell configured to receive a supply of a fuel for generating said charging current.

The operational condition may further include whether or not the electronic device is in an in-flight mode. This is advantageous as the interruption of the charging current may only occur when the device is being used in an in-flight mode. The controller may be configured to interrupt the supply of charging current when the operational condition of the electronic device indicates that the electronic device is not in use and is in an in-flight mode. This may prevent inconvenience to the user when the electronic device is not in use (and therefore interruption of the charging current may occur) but not in an aircraft.

The controller may be configured to determine whether or not the electronic device is in an in-flight mode by monitoring the availability of predetermined communication channels provided by the electronic device.

The controller may be configured to, on interruption of the supply of the charging current, allow an operational current to flow which is lower than the charging current and insufficient to charge the battery of the electronic device. Alternatively, interruption of the charging current may comprise halting power generation by the power supply apparatus. Lowering of the supply current to a level at which the battery is not able to be charged may be advantageous because rather than cease supply of power, the device may be able to be operated using power from the apparatus without draining the battery.

The controller may be configured to determine whether or not the electronic device is in use by determining one or more of;
 i) processor utilisation of a processor of the electronic device
 ii) display illuminator status of a display illuminator of the electronic device
 iii) the receipt of user input to the electronic device
 iv) ambient light conditions
 v) movement
 vi) ambient sound levels One or more or all of these "activity conditions" may need to be satisfied for the charging current to be interrupted. Each activity condition may have an associated threshold value beyond which it is considered to indicate non-use of the device. The threshold may include a time element where the particular activity condition must be below a particular value for a predetermined period of time. Thus, the threshold for the processor utilisation may be 5% of maximum utilisation for example. The display illuminator status may be required to be "off" to indicate non-use. The threshold for receipt of user input may comprise a period of time since the last user input was received. The ambient light threshold may comprise a particular light brightness level, such as substantially no detected ambient light. The threshold for motion may be a predetermined time period where no motion is detected or a time period over which only motion below a predetermined acceleration threshold is detected. In other embodiments, an acceleration threshold may be used instead of a time based threshold. The threshold for ambient sound levels may comprise a predetermined time period where no sound is detected or a time period over which only sound below a predetermined magnitude threshold or frequency profile is detected.

The power supply apparatus may include a light sensor and may be configured to provide information of the ambient light conditions to the controller. Thus, the controller may include its own sensors to determine the likelihood of the electronic device being in use. The operational condition may include a determination of whether or not the ambient light level received from the light sensor is below a predetermined threshold. For example, the electronic device may have been placed in a storage bin, bag or cupboard and the ambient light conditions may be indicative of whether the electronic device is in use.

The controller may form part of the power supply apparatus. The controller may form part of the electronic device or comprise an application thereon. The controller may be distributed over the power supply apparatus and electronic device.

According to a fourth aspect of the invention we provide a power supply apparatus including the controller of the third aspect of the invention.

According to a fifth aspect of the invention we provide a computer program or computer program product configured to be executed on an electronic device for controlling the supply of a charging current from a power supply apparatus to the electronic device, the computer program including code which, when executed, performs the function of the controller of the third aspect of the invention.

According to a sixth aspect of the invention, we provide a power supply apparatus configured to be coupled to an electronic device to supply power thereto to charge a battery of the electronic device, the apparatus comprising a fuel cell configured to receive a supply of a fuel for generating said electrical power, and a controller configured to, while the apparatus is coupled to the electronic device, automatically interrupt the supply of power to the electronic device based on a user-selectable charge level less than fully charged.

This may be advantageous as the user of the power supply apparatus can set the charge level they wish the electronic device to reach thereby having control over the amount of fuel consumed. For example, a user may only require a 50% charge level because they know they will reach a mains power outlet shortly where they can charge their electronic device. Thus, they are able to provide a user-selectable charge level of 50% and the power supply apparatus will automatically interrupt the charging process when that charge level is reached.

The controller may be configured to receive the user-selectable charge level in a message from the electronic device. Thus, the electronic device may include an application or "app" that the user can use to set the desired charge level. Alternatively or in addition, the apparatus may include a charge level input interface for receiving user input of the desired charge level.

The controller may be configured to monitor the power supplied to the electronic device and, using a predetermined power flow profile for the electronic device and the charge level message, interrupt the supply of power when the power flow to the electronic device reaches a level equivalent to the desired charge level.

The controller may be configured to monitor the charge level of the battery of the electronic device using a charge level message received from the electronic device which reports the charge level to the controller.

The controller may be configured to receive an interrupt supply message from the electronic device and, in response to said message, automatically interrupt the supply of power to the electronic device. Thus, the electronic device (possibly by way of an application on the electronic device) may be configured to receive the user-selectable charge level and, when the charge level of the battery reaches the user selected charge level, send the interrupt supply message to the apparatus to interrupt the supply of power. The controller may be considered to reside on both the power supply apparatus and the electronic device.

According to a seventh aspect of the invention, we provide a controller for a battery powered electronic device, the controller configured to control a power supply apparatus adapted to be coupled to the electronic device to supply electrical power thereto to charge the battery, the power supply apparatus comprising a fuel cell configured to receive a supply of a fuel for generating said electrical power, the controller configured to receive a user-selectable charge level less than fully charged and send a control message to the power supply apparatus to interrupt, while the apparatus is coupled to the electronic device, the supply of power to the electronic device based on the user-selectable charge level.

The control message may comprise an interrupt supply message which instructs the power supply apparatus to interrupt the power supply to the electronic device. The controller may be configured to send a selected charge level message containing the user selected charge level to the power supply apparatus and the control message may comprise a charge level message informing the power supply apparatus of the current charge level of the battery.

The controller may comprise a computer program or computer program product having code configured to perform the function of the controller of the seventh aspect. Thus, the electronic device may include an "app" for providing control of the charging process from a portable fuel cell power supply apparatus.

DESCRIPTION OF THE DRAWINGS

There now follows, by way of example only, a detailed description of embodiments of the invention with reference to the following figures, in which.

DETAILED DESCRIPTION OF THE INVENTION

Figure 1:
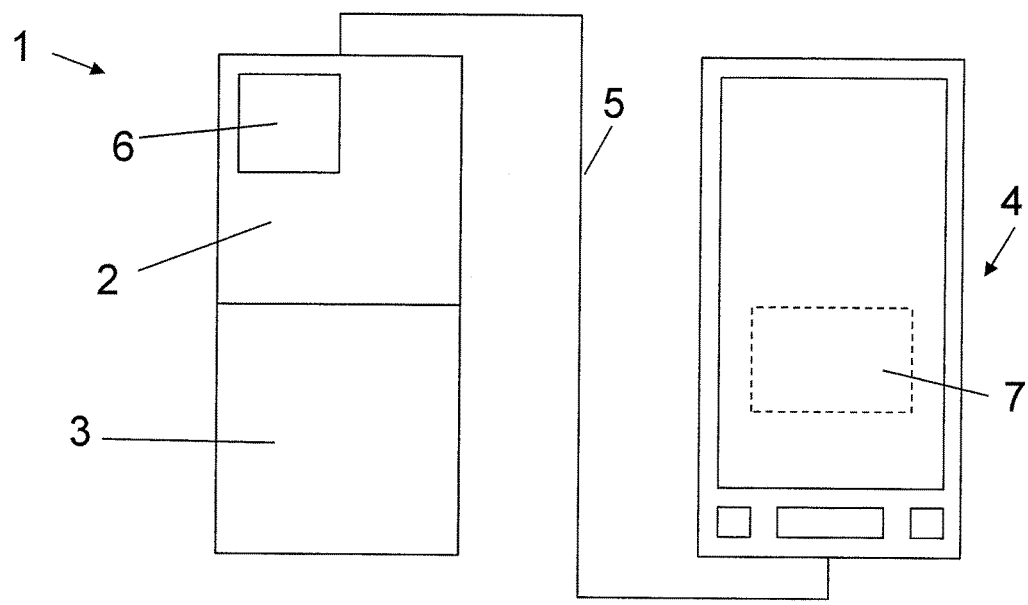
FIG. 1 shows a power supply apparatus connected to an electronic device.

FIG. 1 shows a power supply apparatus 1 comprising a fuel cell 2 configured to receive a supply of fuel from a fuel storage vessel 3 for generating electrical power. In this embodiment, the power supply apparatus 1 is portable and the fuel storage vessel 3 is configured to be replaceable. The power supply apparatus 1 is shown coupled to an electronic device 4 to supply power thereto. The electronic device 4 is coupled to the apparatus 1 by a cable 5, such as a USB cable. It will be appreciated that the electronic device 4 could be coupled to the apparatus 1 by an inductive coupling such that power is supplied by way of an electromagnetic field or by any other cable or power transfer means. The apparatus 1 includes a controller 6 configured to determine the power flow to the electronic device 4 to interrupt the supply of power to the electronic device 4 prior to a battery 7 of the electronic device reaching a fully charged state. The battery charge state may be reported to the apparatus by the electronic device. However, in this example, this is achieved by determining when the current flow between the apparatus 1 and the electronic device 4 falls below an above-zero threshold current determined by said controller 6.

Figure 2:
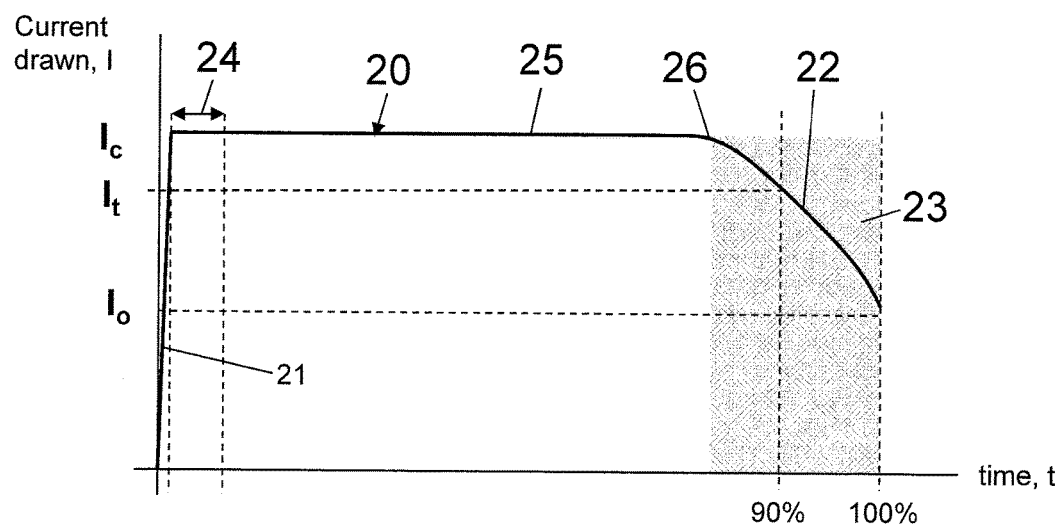
FIG. 2 shows a graph of a current draw of a first electronic device receiving power from the power supply apparatus for charging a battery of the electronic device.

FIG. 2 shows a plot 20 of the current drawn by the electronic device 4 over time as the battery 7 of the electronic device 4 is being charged by the power received from the power supply apparatus 1. The electronic device 4 is connected at t=0 and the current increases sharply over an initial connection period 21. If the device 4 is connected by a USB port, the initial connection period 21 may comprise a handshaking period when the USB device is first connected. The current reaches a substantially stable value, $I_c$, representing a charging current after the initial connection period 21. The charging current has been found to be relatively constant while the battery 7 of the electronic device 4 is being charged. Towards the end of the charging process, it has been found that the current drawn by the electronic device 4 decreases as shown by region 22. In this example the start of the decreasing current draw occurs at around an 85% charge level of the battery, although this may depend on the battery and type of electronic device 4. The current drawn by the electronic device 4 decreases up until the battery is fully charged (marked 100%). From then, the device draws an operating current $I_o$ which powers the operation of the electronic device 4 (if active) rather than charging its battery, although, it will be appreciated that some current may be used to keep the battery at 100% charged.

The fuel cell 2 may be configured to supply the required voltage and current, $I_c$, efficiently. However, during the period in which there is a decrease in current draw, represented by the shaded area 23, the fuel cell operates at a reduced efficiency. It has been found that there may be significant wastage of fuel from the fuel storage vessel 3 when the electronic device 4 is drawing a current less than $I_c$ because the fuel cell is operating less efficiently than when supplying current $I_c$. If the power supply apparatus is a portable device with a limited amount of fuel in the fuel storage vessel 3, it is beneficial for it to operate efficiently.

The controller 6 may therefore be configured to control the fuel cell 2 such that it interrupts the provision of power to the electronic device 4 before the electronic device is fully charged. The interruption may occur when the current drawn by the device falls below a threshold current, $I_t$. In this example, with this particular electronic device 4, the current value $I_t$ corresponds to a charge level of approximately 90% of fully charged. By interrupting the supply of power at this point, the time spent supplying power in the region 23 is reduced therefore improving efficiency. Thus, the controller 6 may interrupt power generation by the fuel cell when the current draw reaches $I_t$, leaving the battery charged to 90%. It will be appreciated that the threshold current $I_t$ may alternatively be considered to correspond to a particular fuel cell efficiency. Thus, when operation of the fuel cell 2 falls below a threshold efficiency value, the controller 6 may interrupt the supply of power. The general shape of the plot 20 has been found to be common to many electronic devices when charging. Therefore, rather than charge the battery to a fully charged state, the controller interrupts the supply to maintain efficiency of the fuel cell 2. Although this example relates to a fuel cell power supply apparatus, the invention may be beneficial for any portable power generation device.

The controller may reconfigure the apparatus 1 such that the supply of power is resumed at the operating current $I_o$ rather than inefficiently charging the battery. Thus, the controller may reconfigure the apparatus 1 to provide a different output voltage. The controller may be configured to monitor the current drawn by the electronic device 4 and monitor the performance of the fuel cell 2 and select an output voltage based on these two conditions.

In a first example, the threshold current may comprise a predetermined value. Alternatively, the threshold current may be calculated by the controller 6. In one example, the controller may determine the current draw of the electronic device during an initial period after the electronic device 4 is connected to the apparatus 1. The initial period may comprise a period of time from the moment the apparatus 1 and electronic device 4 are coupled. An average current draw may be calculated over the initial period. The initial period may start only when the current draw has reached a stable (within limits) value. As shown in FIG. 2, the initial period 24 is temporally positioned such that the change in current draw on initial coupling in region 21 is ignored. The period 24 may comprise a predetermined period of time or a predetermined number of sampled measurements by the controller 6.

The controller 6 may sample the current drawn over the period 24 to determine the "charging current" of the electronic device, comprising the substantially constant current drawn during a period 25 prior to the electronic device 4 reducing its current draw in region 22. Accordingly, the controller may determine the initial current draw as $I_c$. The controller may then be configured, using the measured current flow, to determine the threshold current, $I_t$. In this example, the threshold current comprises a percentage, such as 80% of the charging current $I_c$, which the controller may calculate. Alternatively a look-up table may be provided which the controller 6 may consult using the measured value to determine the threshold current.

In a further example, the controller may categorise the electronic device 4 by the measured current drawn and assign a threshold current accordingly.

Figure 3:
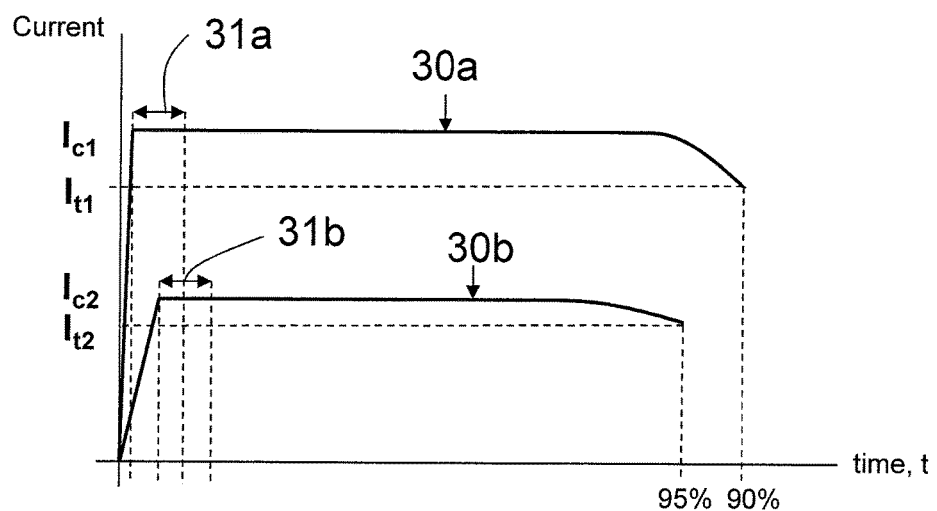
FIG. 3 shows a graph of a current draw of the first and a second electronic device receiving power from the power supply apparatus for charging a battery of the electronic device.

FIG. 3 shows two battery charging profiles of two different electronic devices. The first profile 30a comprises the profile of a mobile telephone for example. The second profile 30b comprises the profile of a portable music player for example. It will be appreciated that the profiles 30a and 30b could be for any electronic device. The controller 6 is configured to measure the initial current drawn by the device using the techniques described above. The controller 6 may therefore identify the first device as having a charging current draw of $I_{c1}$ and the second device as having a charging current draw of $I_{c2}$. Based on these values, the controller is configured to categorise the two devices in one of two classifications; a "high draw" device or a "low draw" device. The controller may have predefined current draw ranges for the purpose of classifying the device. Alternatively the controller may include a predetermined classification current wherein if the measured current is above the classification current it is classified as a "high draw" device and if the measured current is less than or equal to the classification current the device is classified as a "low draw" device. This classification approach may be advantageous as it has been found that many electronic devices charge at substantially one of two current levels.

Once the controller has classified the device, the threshold current at which charging of the device's battery is interrupted is determined. The threshold current may be predetermined based on the classification. Alternatively, the threshold current for the first category may comprise a first percentage of the measured current while the threshold current for the second category may comprise a second percentage of the measured current. It can be seen from FIG. 3 that the first profile 30a has a threshold current $I_{t1}$ which comprises 80%, for example, of the charging current measured during the initial period 31a. The second profile 30b has a threshold current $I_{t2}$ which comprises 90%, for example, of the charging current measured during the initial period 31b. As a result of these threshold current limits, charging of the first device happens to be interrupted at approximately 90% of fully charged and charging of the second device happens to be interrupted at approximately 95% of fully charged.

In a further example, the threshold current may comprise the current reached after a predetermined period of time once a decrease in current draw (above a decrease threshold) is detected, such as a period of time after point 26 of FIG. 2. The decrease threshold may prevent fluctuations in the charging current starting the timer before point 26 is reached.

The apparatus may be further configured to identify whether or not the power supplied to the electronic device 4 from the fuel cell 2 is being used to charge its battery or just to operate the device. In general, the current drawn by a device 4 that is just being operated is lower that when it is charging its battery. Thus, the controller may be configured with a further current threshold or range, which may be at a current level below the categories described above. A device drawing a current below the further current threshold is considered to be operating rather than charging its battery and therefore interruption of the power supply when the current draw falls is disabled so that the device can be operated continuously.

In a further example, the threshold current may be determined using information that identifies the electronic device 4 which is connected to the apparatus 1. In particular, when the electronic device is connected/coupled to the apparatus 1 it may report its vendor ID and/or product ID as part of an identification message. Such an identification message may be part of a pre-existing standard, such as a USB standard or a plug and play (PnP) standard.

The controller 6 may be configured to receive the identification message and using predetermined device-specific or device-type-specific information determine a threshold current for the electronic device. Thus, the charge profiles of devices or categories of device (mobile telephone, laptop etc.) may be predetermined and stored in a memory of the controller. The charge profiles may comprise information identifying one or more of the threshold current, the point at which the current drawn decreases, the battery charge level reached at different current draw levels or any other information about how the particular device or category of device typically receives power for charging. The controller may therefore derive the threshold current from predetermined data using the identification message.

In a further example, the controller 6 may use a communication element to request the threshold current to use for a particular device. For example, the controller 6 may interrogate a server on the internet for the threshold current to use. The controller 6 may use communication capabilities of the electronic device 4 to perform this function. Thus, the electronic device may include an application or "app" that provides an interface for the apparatus 1. Accordingly, the controller 6 may use the interface provided by the app to download a charging profile and/or threshold current to use when supplying power to the device.

Thus, the app may be adapted to send an identification message for informing the apparatus 1 of the type of device and/or may be adapted to send a charge profile message, informing the apparatus of the current threshold at which to interrupt the supply of power.

In a further example, the controller 6 may be configured to automatically interrupt the supply of power to the electronic device prior to the battery of the electronic device reaching a fully charged state based on a user-selectable charge level. Thus, the electronic device 4 may include a controller, which in this example is embodied as software as an "app" executable on the electronic device 4, that may receive user input of a desired charge level.

The user, using the app, may be able to specify a particular charge level or select from a plurality of options, such as 10%, 20%, 30% . . . 70%, 80% or 90% charged. It will be appreciated that the granularity of the options as well as the minimum and maximum selectable charge levels could be other values. As a portable fuel cell power supply apparatus 1 will have a limited supply of fuel, providing the user with a selectable option to automatically stop charging in advance of a fully charged state is advantageous as fuel can be conserved. For example, the user may only require a few hours of usage from the electronic device before they will arrive home where mains electricity is available for charging the device. Accordingly the user may determine that a 50% charge level will suffice for this period of time and their expected usage. Thus, they are able to provide a user-selectable charge level of 50% and the power supply apparatus will automatically interrupt the charging process when that charge level is reached. The app may automatically prompt the user for a desired charge level when the power supply apparatus is connected to the electronic device prior to charging commencing.

The app may be configured to communicate with the power supply apparatus 1 or the controller 6 thereof to inform the power supply apparatus of the charge level selected by the user in a charge level electronic message. The message may be supplied via the cable 5. The power supply apparatus 1 may then decide when to interrupt the supply of power to achieve the selected charge level. Rather than an app on the electronic device, the power supply apparatus may include a user input interface, such as a keypad, for receiving user input of the desired charge level.

The controller 6 may use a predetermined charge profile of power flow versus charge level. Thus, the charge level message may be received and the power flow level or current flow level corresponding to that charge level may be determined. The controller can then automatically interrupt the supply of power when the power flow is reached. Alternatively, the app may report the charge level to the controller 6 periodically and the controller 6 can interrupt the power supply at the appropriate time.

However, in this example, the app on the electronic device 4 is configured to monitor the charge level of the battery 7 during charging and determine when the charge level reaches the user selected charge level. When this occurs, the app is configured to send an interrupt supply electronic message via cable 5 to the power supply apparatus 1 and, in response to said message, the controller 6 is configured to automatically interrupt the supply of power to the electronic device. It will be appreciated that while it has been stated that the messages between the electronic device 4 and apparatus 1 are sent via the cable 5, other communication channels may be used, such as wireless communication.

Figure 4:
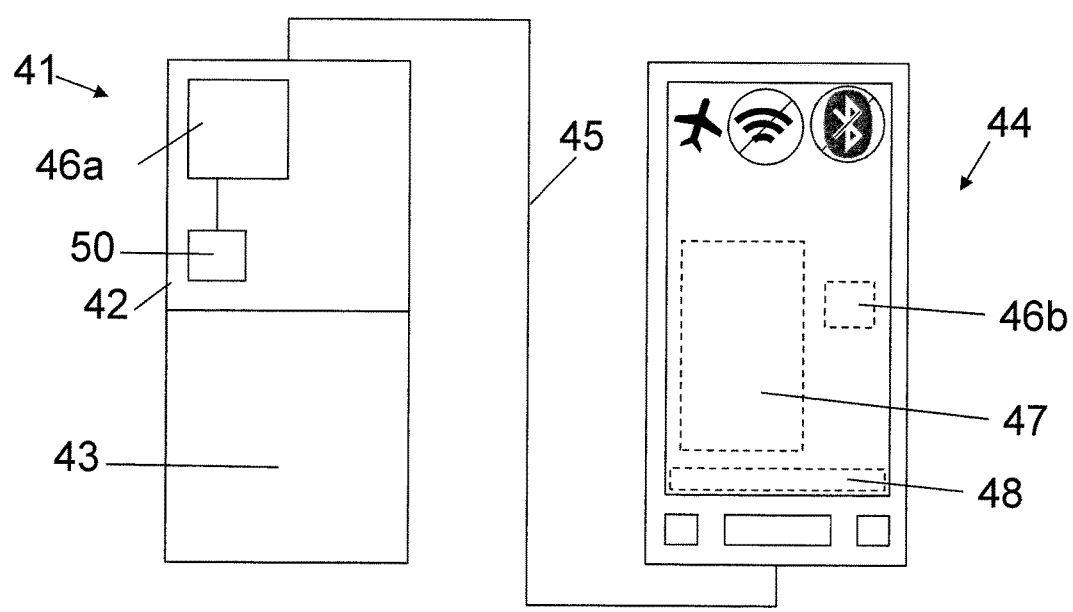
FIG. 4 shows a power supply apparatus connected to an electronic device having an in-flight mode activated.

FIG. 4 shows a power supply apparatus 41 similar to that shown in FIG. 1 and corresponding reference numerals have been used. In this figure, the electronic device 44 is in an in-flight mode. The use of electronic devices on aircraft is subject to restrictions. The power supply apparatus 41 described herein provides a convenient and portable source of electrical power and therefore it may be advantageous to control how the apparatus provides power to satisfy aircraft restrictions.

A controller 46a, 46b is configured to control the flow of a charging current for charging a battery 47 of the electronic device 44. The charging current is supplied via cable 45 by the power supply apparatus 41 or, more specifically, a portable power generation apparatus having a limited energy supply. The power supply apparatus 41 comprises a fuel cell 42 configured to receive a supply of a fuel from a replaceable fuel storage vessel 43 for generating said charging current. The controller 46a, 46b is configured to, based on a determination of an operational condition of the electronic device 44, said operational condition comprising whether or not said electronic device 44 is being used by a user, interrupt the supply of the charging current from the power supply apparatus 41. Thus, the controller is able to prevent charging of the battery of the electronic device if it is detected that the device is not being used by the user and may therefore be unattended.

The controller 46a, 46b is also configured to determine whether or not the electronic device is in an in-flight mode. Thus, the operational condition may be such that two factors need to be satisfied before the charging current is interrupted. Namely, the electronic device must be in an in-flight mode and also that the electronic device is not currently being used and may therefore be unattended.

The fuel cell charger 42 is connected to the electronic device 44 by a power and communications cable 45, such as a USB cable. Thus, the apparatus 41 can supply power for charging a battery 47 of the device 44, provide power for operating the device 44 without charging the battery 47 and also communicate with electronic device. Thus, the power supply apparatus 41 includes part of the controller 46a, which may be embodied as software and executed on a processor of the apparatus 41 or may be provided as a hard-wired controller. The electronic device 44 also includes a part of the controller 46b, which is provided as an application or "app" that is executed on the electronic device 44. In this embodiment, the electronic device comprises a "smartphone", although, it will be appreciated that any electronic device capable of executing software for communicating with the apparatus 41 may be used.

The controller parts 46a and 46b communicate to control the flow of power from the fuel cell 42 to the electronic device. In a first example, the controller 46b reports one or more activity indicators to the controller 46a. The activity indicators provide the controller 46a with information indicative of whether the device 44 is being used by a user. Thus, the controller 46b may report one or more of;
  i) processor utilisation of a processor of the electronic device 44
  ii) display illuminator status of a display illuminator 48 of the electronic device 44
  iii) the receipt of user input to the electronic device 44
  iv) detection of movement or motion from motion sensors (not shown)
  v) ambient sound levels The controller 46b may therefore interrogate the operating system of the electronic device for this information. The processor utilisation may be requested by the controller 46b and then reported to the controller 46a. If processor utilisation is below a threshold value it may be considered that the device is not being actively used by a user. Accordingly, the controller 46a may interrupt the charging current to the device.

The status of the display may also be used as an indication of the device being used. Many electronic devices 44 have illuminated displays, such as liquid crystal based displays. Such displays typically include a display illuminator 48 or backlight. The controller 46b may be configured to determine the status of the display illuminator 48. If the illuminator is turned off, it is indicative of the device 44 not being actively used. The controller 46b may report the status of the display illuminator 48 to the controller 46a for controlling the charging current.

The controller 46b may also determine whether or not the device 44 is receiving user input and/or the frequency of the user input. This may be determined from button presses or interaction with a touch sensitive display. The absence of user input for a threshold period of time may be indicative of whether or not the device is in use. Thus, the controller 46b may report the user input frequency to the controller 46a.

The controller 46b may also determine whether or not the device 44 is being moved using accelerometers, gyroscopic sensor or other movement sensors of the electronic device 44. It is common for electronic devices such as mobile telephones to include accelerometers. If motion is not detected for a predetermined period of time, it may be indicative of the device not being used. Alternatively or in addition, the power supply apparatus 41 may include motion sensors to determine information indicative of the electronic device being in use.

The controller 46b may also determine whether or not the device 44 is in use by using a microphone of the electronic device to detect ambient sound levels. If the electronic device is a mobile telephone, the controller 46b may use an in-built microphone used for conducting calls. For example, if the ambient sound levels are below a predetermined magnitude threshold or audio threshold, it may be indicative of the electronic device being unused or stored in a bag or the like. The controller 46b may analyse the sounds detected by the microphone (such as the frequency profile and/or amplitude profile) to determine if they are muffled, which may be indicative of the electronic device being located in a bag or storage bin (and therefore not in use) rather than in the open cabin of an aircraft (and therefore in use). The fuel supply apparatus may be provided with a microphone for such a purpose.

It will be appreciated that other activity indicators may be used, such as input from position or orientation sensors. For example, smartphones include a plurality of sensors and the output from these sensors, determined by controller 46b, may be used to assess the operational status of the smartphone.

It will be appreciated that in the above paragraphs the controller 46b is used to collect data and report that data to the controller 46a. However, the controller 46b in the electronic device may be configured to make decisions on whether the charging current should be interrupted based on the monitoring of the activity indicators. Thus, in another example, the controller 46b may send an instruction to the controller 46a to interrupt the supply of the charging current.

In a further example, a light sensor may be used to determine if the electronic device 44 is in use. The electronic device 44 may be equipped with a light sensor and the controller 46b may determine its status. If the light level sensed by the sensor is below a threshold value, the controller 46b or controller 46a may determine that the device is not in use and therefore (subject to any other activity indicators used) interrupt the charging current. The light sensor may comprise a camera of the electronic device. For example, if the electronic device is a mobile telephone, one or both of a front facing camera or rear facing camera may be used to detect ambient light levels. The cameras may have light level meters associated therewith that are used.

Alternatively or in addition, the power supply apparatus 41 may include a light sensor 50. The light sensor 50 may be used to determine if the power supply apparatus 41 (perhaps when connected to an electronic device 44) is in use or stored away. Thus, using the example of use on an aircraft, if the power supply apparatus 41 is connected to an electronic device and is supplying a charging current to charge its battery 47, the controller 46a may use the light sensor 50 to determine whether the device is being used in the cabin (where it would detect light) or if the apparatus 41 and device 44 are stowed away in an overhead bin or seat pocket (where it would detect little or no light). If the controller 46a determines, using the light sensor 50, that the apparatus is in darkness (i.e. the measured light level is below a predetermined threshold) then it may interrupt the charging current (subject to any other activity indicators).

It may be advantageous to limit instances of the fuel cell 42 interrupting the supply of the charging current to when the power supply apparatus 41 and electronic device 44 are being used on an aircraft. Thus, the controller 46a, 46b may be configured to determine whether or not the electronic device is in an in-flight mode.

An in-flight mode is a common feature on many electronic devices that have wireless communication channels, such as cellular network (GSM, UMTS for example), WiFi and/or Bluetooth. The in-flight mode disables the wireless communication channels to prevent interference with the aircraft's systems. The controller 46b may be configured to interrogate the operating system of the electronic device 44 to determine if the device 44 is in an in-flight mode. Accordingly, the controller 46a, 46b can decide whether or not to interrupt the supply of the charging current based on the activity indicators only when the in-flight mode is active.

In another example, the operating system of the electronic device may not be configured to report the selection status of an in-flight mode and therefore it may be necessary for the controller 46b to assess parameters indicative of an in-flight mode. For example, the controller 46b, comprising an "app" in this example, is configured to request the current availability status of the communication channels of the device 44. The operating system of the electronic device 44 may report that communication is not currently possible via the known communication channels of the device 44. The controller 46b may infer from this that the user has activated the in-flight mode of the electronic device 44. Accordingly, the controller 46a, 46b is able to control the charging current accordingly, as described above.

The charging current may comprise a current level (which may be particular to the electronic device 44 and its battery 47), at which the battery is charged. It may be possible to supply power to the electronic device 44 at a lower level which is sufficient to power the operation of the electronic device 44 without charging the battery 47. Thus, the interruption of the charging current may comprise reducing the power supplied by the apparatus 41 to a level where the battery 47 is not being charged. Alternatively, the interruption of the charging current may comprise halting power transfer to the electronic device 44.

In a further embodiment, the controller 46 is located solely in the apparatus 41 and the operational condition is determined using the light sensor 50, for example.

The term battery has been used to define an energy store of the electronic device. It will be appreciated that the term battery is intended to include any energy storage device, such as an electrochemical battery or a capacitor.

The invention claimed is:

1. A power supply apparatus for providing electrical power, the power supply apparatus configured to be coupled to an electronic device to supply power thereto to charge a battery of the electronic device, the apparatus comprising:
   a fuel cell configured to receive a supply of a fuel for generating said electrical power; and
   a controller configured to, based on a determined power flow to the electronic device, interrupt the supply of power to the electronic device prior to the battery of the electronic device reaching a fully charged state;
   wherein the controller is configured to interrupt the supply of power to the electronic device when the current flow between the apparatus and the electronic device falls below an above-zero threshold current determined by said controller;
   wherein the controller is configured to measure a current flow between the apparatus and the electronic device;
   wherein the controller is configured to, based on the measured current flow, categorise the electronic device to one of a plurality of categories, wherein each category is associated with a different threshold current.

2. A power supply apparatus according to claim 1, in which the controller is configured to determine the threshold current on coupling of the electronic device and the apparatus.

3. A power supply apparatus according to claim 2, in which the controller is configured to, based on said measured current flow, determine the threshold current.

4. A power supply apparatus according to claim 3, in which the controller is configured to measure the current flow for determining the threshold current for a predetermined period from when the electronic device is coupled to the apparatus.

5. A power supply apparatus according to claim 1, in which the controller is configured to receive a message indicating the threshold current to use for the coupled electronic device.

6. A power supply apparatus according to claim 1, in which the controller is configured to receive an identification message from the electronic device which identifies the electronic device to the controller and, using the identification message, determine the threshold current to use in supplying power to said electronic device.

7. A power supply apparatus according to claim 1, in which the controller is configured to receive a charge profile message from the electronic device and, using the charge profile message, determine the threshold current to use in supplying power to said electronic device.

8. A power supply apparatus according to claim 1, in which the controller is configured to determine when to interrupt the supply of power based on an efficiency level of the fuel cell falling below a predetermined efficiency level.

9. A power supply apparatus according to claim 1, in which the apparatus is portable and configured to receive a replaceable cartridge of fuel.

10. A power supply apparatus according to claim 1, wherein the interruption of the supply of power to the electronic device is based on a user-selectable charge level that is less than fully charged.

11. A power supply apparatus according to claim 10, in which the controller is configured to receive the user-selectable charge level in a message from the electronic device.

12. A power supply apparatus according to claim 1, wherein:
   the plurality of categories comprises a first category and a second category,
   the first category has a threshold current comprising a first percentage of the measured current flow;
   the second category has a threshold current comprising a second percentage of the measured current flow.

13. A power supply apparatus according to claim 1, wherein the measured current flow comprises an initial current drawn by the electronic device.

14. A power supply apparatus according to claim 1, wherein:

the plurality of categories comprises a first category and a second category;
the controller is configured to categorize the electronic device to the first category if the measured current flow is less than or equal to a classification current; and
the controller is configured to categorize the electronic device to the first category if the measured current flow is above the classification current.

* * * * *